(12) United States Patent
Kildal (10) Patent No.: US 7,286,961 B2
(45) Date of Patent: Oct. 23, 2007

(54) METHOD AND AN APPARATUS FOR MEASURING THE PERFORMANCE OF ANTENNAS, MOBILE PHONES AND OTHER WIRELESS TERMINALS

(75) Inventor: Per-Simon Kildal, Pixbo (SE)

(73) Assignee: Kildal Antenna Consulting AB, Pixbo (SE)

( * ) Notice: Subject to any disclaimer, the term of this patent is extended or adjusted under 35 U.S.C. 154(b) by 108 days.

(21) Appl. No.: 11/172,826

(22) Filed: Jul. 5, 2005

(65) Prior Publication Data

US 2006/0017630 A1    Jan. 26, 2006

Related U.S. Application Data

(63) Continuation-in-part of application No. 10/239,582, filed on Sep. 24, 2002.

(51) Int. Cl.
*G06F 11/30* (2006.01)

(52) U.S. Cl. .................................................... 702/182
(58) Field of Classification Search ................ 702/182
See application file for complete search history.

(56) References Cited

U.S. PATENT DOCUMENTS

| | | | |
|---|---|---|---|
| 4,379,991 A | 4/1983 | Ho et al. |
| 4,800,387 A | 1/1989 | Joy |
| 4,860,602 A | 8/1989 | Hines et al. |
| 4,901,080 A | 2/1990 | McHenry |
| 4,906,668 A | 3/1990 | May et al. |
| 4,906,998 A | 3/1990 | Shibuya |
| 4,931,798 A | 6/1990 | Kogo |
| 5,001,494 A | 3/1991 | Dorman et al. |
| 5,134,405 A | 7/1992 | Ishihara et al. |
| 5,530,412 A | 6/1996 | Goldblum |
| 5,977,532 A | 11/1999 | Ekemar |
| 6,021,315 A | 2/2000 | Telewski |
| 6,088,582 A | 7/2000 | Canora et al. |
| 6,311,075 B1 * | 10/2001 | Bevan et al. ............ 455/562.1 |
| 6,525,657 B1 | 2/2003 | Wojcik |
| 2003/0008620 A1 * | 1/2003 | Rowell et al. ............ 455/67.1 |

FOREIGN PATENT DOCUMENTS

| | | |
|---|---|---|
| DE | 196 26 931 A | 1/1998 |
| DE | 198 12 923 A1 | 9/1999 |

OTHER PUBLICATIONS

Patent Abstract of Japan, 10026645A, Jan. 27, 1998, Arai Hiroyuki et al.

\* cited by examiner

*Primary Examiner*—John Barlow
*Assistant Examiner*—Demetrius Pretlow
(74) *Attorney, Agent, or Firm*—Harness, Dickey & Pierce, P.L.C.

(57) ABSTRACT

An apparatus and a method for measuring the receiver sensitivity of mobile and wireless terminals is disclosed, including a chamber to enclose the terminal to be tested (TUT). The chamber includes walls of an inwardly reflective material, rendering the walls reflective to electromagnetic waves, and at least one movable object within the chamber. The terminals include at least both a receiver and an antenna. The apparatus further includes an instrument to measure bit error rate (BER) or frame error rate (FER) connected to an antenna inside the chamber and set up to communicate with the TUT, wherein the received signal on the TUT shows fading obtained by moving the movable objects within the chamber.

26 Claims, 7 Drawing Sheets

METHOD AND AN APPARATUS FOR MEASURING THE PERFORMANCE OF ANTENNAS, MOBILE PHONES AND OTHER WIRELESS TERMINALS

This application is a continuation-in-part of U.S. Ser. No. 10/239,582 filed Sep. 24, 2002.

BACKGROUND

Mobile and wireless telephony has grown enormously the last years, and it is expected to continue to grow all over the world. In addition, more and more services are added to the mobile phones, such as access to Internet. In a mobile communication system the mobile phones are terminals, and the network is formed by wireless connection of each terminal to the nearest fixed base station, where the base stations are connected together with other base stations in a fixed network. The next years we will also see a rapid growth of short-range microwave links, such as Bluetooth systems. In a Bluetooth system two terminals, which are located up to 100 m apart, communicate directly with each other.

Bluetooth and similar wireless short-range communication links are intended to replace all existing signal cables, e.g. the mouse, keyboard and network cables of a PC, and the headset cable of a mobile phone. Bluetooth will also open numerous new possibilities to locate sensors, and transfer signals from sensors, as well as from and to control units in machines and factories.

Many of the above-mentioned terminals are located in a so-called multi path environment. This means that the electromagnetic waves (which are modulated with the signal) will take many simultaneous paths between the transmitting terminal (or base station) and the receiving terminal. These paths are caused by reflections from objects like buildings, walls, trees, cars and furniture, as well as from human beings and animals.

The antennas on the terminals are therefore preferably designed for operation in multipath environment. This means that the shape of the radiation pattern plays a minor roll. The most important performance parameter is for the transmit case the radiation efficiency. The higher radiation efficiency the better, i.e., the more power is radiated out of the terminal antenna the better. The radiation efficiency has three main contributions: the transmission efficiency due to reflections (i.e. mismatch) at the antenna port, the efficiency reduction due to ohmic losses in the antenna itself, and the efficiency reduction due to ohmic losses in the near-in external environment of the antenna. This near-in environment may change depending on how the antenna or terminal is operated. An example is the loss in the human head and hand during operation of a mobile phone. The relative distribution between the three contributions to the radiation efficiency, as well as the total radiation efficiency itself, will change with the environment.

The radiation efficiency was explained above for a transmitting terminal antenna, but the same terms are used and valid for receive antennas, due to reciprocity.

Traditionally the radiation performance of antennas is measured outdoors or in anechoic chambers. The antenna under test is mounted on a turntable at one end of the measurement chamber or range, and there is a transmit antenna tower at the opposite end. The radiation pattern is obtained as the transmission between the two antennas as a function of the rotation angle of the turntable. In order to obtain the radiation efficiency, we need to measure the radiation pattern in all directions in space and integrate the received power density to find the total radiated power. This will then give the radiation efficiency when compared with the corresponding power integral of a reference antenna. This traditional measurement set-up requires expensive equipment, much work, and the final result is obtained after a long measurement procedure. In addition, the measured radiation patterns are not of much interest for terminal antennas.

As already explained the radiation efficiency depends on the near-in environment in which the antenna is located. Therefore, the terminal antenna needs to be tested out in such environments, e.g., a mobile phone antenna needs to be tested out at different positions and orientations relative to the human hand and head. Different terminal antennas will behave differently in different environments, and a good antenna will keep high radiation efficiency in different environments. Therefore, a lot of measurements of terminal antennas in different environments need to be done. This is very time-consuming and expensive with traditional radiation pattern measurements.

Similar problems as related above are encountered when measuring the total radiated power from the whole mobile or wireless terminal, such as from a mobile phone. Further, it is a problem with known measuring equipment to make a quick, easy and/or reliable estimation of the absorption of electromagnetic radiation in the human body. This is important, due to possible health effects, but also because absorption reduces the total radiated power outside the human body, which is used to communicate. In a mobile phone, we refer to this outer radiated power as the telephone communication power (TCP or simply CP). This is the total power radiated by the phone minus the power lost in the human body. The larger this communication power (CP) is, the better will the phone work when it is located in an environment where the signal from the base station is low. Existing equipment that is used to measure radiation into the human body is very expensive and laborious to use.

In respect of receive performance, this is normally either characterized by a Bit-Error-Rate (BER) or a Frame-Error-Rate (FER), depending on which system terminals are designed for, where the latter frame consist of several bits that are coded in a special way to reduce errors. The BER or FER will depend on the signal level present at the receiver. Therefore, the receiver sensitivity is defined as the level which provides a certain BER or FER, often chosen to be 0.5%. It is known how to measure the receiver sensitivity when a signal is connected directly to the port of the receiver of the terminal. This often referred to as conductive measurements because the transmit signal is connected directly to the receiver without including any antenna or environment. Then, however, the performance of the antenna is not included in the measurements. Therefore, it has been described how to measure the receiver sensitivity in an anechoic chamber. This is done by using a base station emulator connected to the transmit antenna in the chamber, and locating the terminal on the turntable. The receiver sensitivity for a certain BER or FER is then determined by analyzing the received signal at the phone, at each of all the directions of incidence on the terminal. The latter directions are obtained by moving the turntable in the anechoic chamber. These receiver sensitivities will vary much with direction, because the receive radiation pattern of the terminal is different for the different directions. Therefore, these values are averaged over all directions (which should be uniformly distributed over the complete unit sphere around the terminal). The averaged results are called a Total Isotropic Sensitivity (TIS), and correspond to the conductive-measured receiver sensitivity minus the total radiation efficiency of the antenna. This TIS can also be measured in a reverberation chamber, by averaging over mode stirred positions and polarizations, thereby corresponding to the measurements of radiation efficiency when the terminal is receiving.

There is therefore a need for an improved method and apparatus for measuring the performance of antennas as well as of complete mobile and wireless terminals, such as mobile phones, and specifically for measuring radiation efficiency, total radiated power, receiver efficiency and receiver sensitivity.

PURPOSE AND CHARACTERISTIC OF THE INVENTION

It is therefore the object of the invention to provide an apparatus and method for measuring the performance of antennas as well as of complete mobile and wireless terminals, such as mobile phones, at least partly solving the problems encountered in the prior art. Further, it is an object of the present invention to provide an apparatus and method for measuring absorbed radiation. Specifically, it is also an object of the present invention to provide an apparatus and a method for measuring receiver sensitivity.

More specifically, the invention relates to an apparatus and instrument set-up for measuring the performance of antennas or mobile and wireless terminals, such as mobile phones. Compared to e.g. a standard antenna measurement range the invention is cheaper and requires much less space and effort. The measurements can also be done much faster, and the accuracy is high.

The parent application U.S. Ser. No. 10/239, 582 describes how the reverberation chamber can be used to measure the radiation efficiency of antennas and the radiated power of mobile and wireless terminals such a cellular phones. Several chamber improvements were introduced to get the desired accuracy. Similar measurement setups that are described in U.S. patent application Ser. No. 10/239,582 can be used also to determine the performance of antenna diversity, i.e. when the outputs of two antennas are combined in such a way that the deepest fading dips are reduced. In this respect, reference is also made to P.-S. Kildal and K. Rosengren, "Correlation and capacity of MIMO systems and mutual coupling, radiation efficiency and diversity gain of their antennas: Simulations and measurements in reverberation chamber", in IEEE Communications Magazine, Vol. 42, No. 12, December 2004.

The above-mentioned previous works describe how antennas and transmitting mobile and wireless terminals, intended for use in fading multipath environment, can be characterized by measurements in a reverberation chamber. However, there is also a need for characterizing mobile and wireless terminals when they are receiving.

The receive performance is either characterized by a Bit-Error-Rate (BER) or a Frame-Error-Rate (FER), depending on which system terminals are designed for, where the latter frame consist of several bits that are coded in a special way to reduce errors. The BER or FER will depend on the signal level present at the receiver. Therefore, the receiver sensitivity is defined as the level which provides a certain BER or FER, often chosen to be 0.5%.

By means of the present invention, a method and an apparatus are disclosed enabling a reverberation chamber to be used to determine the receive performance of a mobile or wireless terminal when it is continuously exposed to a fading input signal, such as in a real environment. The continuous fading is preferably obtainable by moving the stirrers of the chamber continuously rather than in steps, and by measuring the receiver sensitivity for which the BER or FER has the desired value during this continuous movement of the stirrers. The proposed method is much faster than measuring TIS, inter alia because the sensitivity level only needs to be determined once.

By means of the present invention, it is also described how the reference antennas and fixed antennas, discussed in more detail in the following, can be calibrated to obtain the best measurement accuracy. Such calibration ha not been known before.

The inventive reverberation chamber can be used for characterizing the complete performance of mobile and wireless terminals, both on transmit and receive, including transmit and receive performance of antennas, amplifiers, signal processing algorithms, and coding. This opens up a large potentials for RF testing in connection with terminals for more advanced future mobile communication systems referred to as 3G and 4G (third and fourth generation of mobile communication systems). Such systems will make use of more than one antenna for both transmission and reception and will use these to adapt to the fading multipath environment, in order to improve battery life time and data rate. Such systems are known under terms as diversity antenna systems and MIMO (multiple Input Multiple Output) antenna systems. In order to develop optimum diversity and MIMO systems it will be more important than ever to quantify the performance of the terminals and base stations in multipath environments. The reverberation chamber can provide this testing opportunity.

The invention relates to a chamber with reflecting walls. We use here the word wall to describe sidewalls, ceiling and floor. The reflecting walls are most easily provided with metal foil or plates. In at least one of the walls of the chamber there is an access door, which is closed during measurements. The chamber can have any size and shape. The chamber will normally of practical reasons be rectangular. Other shapes, which are easy to realize, are vertical walls with flat floor and ceiling and with a horizontal cross-section that forms a circle, ellipse or polygon.

In one line of embodiments, the chamber is excited by a transmit antenna, which we will refer to as the fixed antenna (FA). This fixed antenna (FA) is a small antenna of any kind, preferably located in a corner of the chamber, and preferably not directing its radiation directly to the central part of the chamber, where the antenna under test (AUT) and its near-in environment is located. The fixed antenna (FA) excites the chamber with several resonant cavity modes. The chamber is preferably large enough to support some hundreds of modes. The more modes are excited, the more accurate are the result for the radiation efficiency. The transmission between the FA and the AUT, or in the opposite direction, are measured and preferably stored for several different mode distributions in the chamber.

In the above description as well as in the description to follow, we normally assume that the FA is a transmit antenna and the AUT is a receive antenna. However, we could also measure the transmission power between them by using the AUT as a transmit antenna and the FA as a receive antenna. The results would be the same.

The AUT can also be replaced by a complete mobile or wireless terminal such as a mobile phone, which we herein refer to as the terminal under test (TUT). In this case the TUT is transmitting power, and we measure the received power at the fixed antenna (FA).

The fixed antenna (FA) is preferably an electric monopole, a helical antenna, a microstrip patch antenna or similar, which is fastened to one of the chamber walls. Further, the FA is preferably connected to the centre conductor of a cable connector that is mounted to the outer side of the chamber wall in such a way that it's centre conductor goes through a hole in the wall. Each mode in the chamber can be described as a standing wave due to eight waves propagating in different directions. Several hundred resonant modes will therefore represent a multipath field environment, with eight times more multipaths than modes.

In order to get an estimate for the radiation efficiency we need to measure the received power at the AUT for some hundreds of different mode distributions when the input power at the terminal of the FA is constant, and average the results. We refer to the ratio between this average received power and the input power of the FA as the average power transfer function of the chamber between the FA and the AUT. It is referred to as a function because it varies with frequency. This average power transfer function is compared with the average power transfer function when we have replaced the AUT by a reference antenna with known radiation efficiency, e.g., a dipole with low loss and good impedance match. The ratio between the two average power transfer functions represents then an estimate of the radiation efficiency of the AUT relative to the radiation efficiency of the reference antenna. The accuracy of the estimate depends on the number of independent measurements of the transmitted power of the FA and the AUT (which cannot be more than the total number of modes excited in the chamber during the measurements). We need typically more than 100 independent measurements of the transmitted power to get accuracy better than 0.5 dB. The transmitted power is normally measured by means of a network analyser.

In order to get an estimate for the communication power (CP) of the TUT we need to measure the received power at the fixed antenna (FA) for some hundreds of different mode distributions, and average the results. The received power is in this case normally measured by using a power meter or preferably a spectrum analyser. The average received power at the FA is proportional to the CP of the TUT. We can find the CP by dividing the average received power at the FA with the average power transfer function of the chamber between the FA and an impedance-matched low-loss reference antenna (see previous paragraph). Another alternative is to compare the average received power at the FA when the TUT is used with the average received power at the FA when a reference terminal with known performance is radiating inside the chamber, e.g., a base station simulator with it's output connected to a low-loss and well-matched dipole antenna. In the latter alternative we must know the output power of the reference terminal, which can be measured by connecting it directly to the input of the power meter or spectrum analyser. We obtain an estimate for the communication power (CP) of the TUT by taking the output absolute power of the reference terminal, multiplying it with the average received power of the TUT (when it is located in the chamber), and dividing it with the average received power of the reference terminal (when it is located in the chamber). The accuracy of the estimate of the CP depends on the number of independent measurements of the received power (which cannot be more than the total number of modes excited in the chamber during the measurements). We need typically more than 100 independent power measurements to get accuracy better than 0.5 dB.

The different mode distributions (for the averaging of the received power) can be obtained in several ways. It is possible to rotate or move the AUT or any other objects in the chamber, because the orientation and location of all objects in the chamber will effect the mode distribution. To get as many independent mode distributions as possible, it is important that the object, which we move or rotate, will scan the chamber's full length, width and height. A convenient way of moving an object is to use a driving means, such as a step motor, which turns a rod, which is connected between two opposite walls of the chamber, running along the corner between two other and joining walls of the chamber. Each rod is preferably provided with threads and a nut, where the nut moves along the rod when it rotates. A long metal sheet or profile or similar, preferably about a half wavelength in width at the lowest frequency of operation, can be fastened to this nut and located transverse to the rod, so that it provides a large movement across one of the walls when the driving means rotates the rod. It is also possible to use two driving means, such as step motors, each rotating a rod with threads, which moves a metal sheet or the like. There can also be two step motors per sheet in order to move both ends of the metal sheet along one wall. Thereby, the metal sheet will cover a larger volume during its movement and hence stir the mode distribution better.

The AUT or TUT can also be located on a platform inside the chamber, which can be rotated or moved to a number of positions. In this case the cable from the AUT to the outside of the chamber is preferably passing through a rotary the centre of the platform. The mode distributions in the chamber will be stirred by rotating or moving the platform, so that we can obtain more independent measurements of the transmitted power or received power. Thereby, the measurement accuracy will improve. We refer to the moving metal sheets as plate stirrers, and to the rotating platform as a platform stirrer. We obtain the best accuracy by both rotating the platform and moving two plates. For each position of the platform, the plate stirrers can be moved sequentially or simultaneously. Sequential movement is the best but takes the longest time. It is possible to run the plate and platform stirrers in different sequences, such as a fast mode for moderate accuracy and a slow mode for good accuracy of the measured radiation efficiency or communication power (CP).

We can also alter the different mode distributions by changing the frequency. The mode distributions become independent when two frequencies are located further apart than approximately the bandwidth $\Delta f$ of the resonances of the chamber. These resonances are normally characterized by their Q-value, $Q=f_0/\Delta f$ where $\Delta f$ is the bandwidth and $f_0$ the resonance frequency. However, when we average the transmission power or received power over different frequencies, we will also remove information about the frequency variation of the radiation efficiency of the AUT and the communication power (CP) of the TUT. In other words, the frequency resolution will be worsened. The frequency averaging is in practice obtained by choosing a bandwidth B, so that the averaged power at any frequency point f is obtained by averaging the measured power levels over a frequency band B centred at the frequency point f.

As explained above, the measurement accuracy can be improved by averaging results at different frequencies, at the expense of a worsening of the frequency resolution of the resulting radiation efficiency or communication power. The accuracy obtained by frequency averaging can be significantly improved if we remove known frequency dependent terms from the power samples before the frequency averaging is performed. We can do this by one or more of the three signal processing methods described below:

1) The transmitted or received power level may contain an error term, which is due to direct coupling between the AUT and the FA, or alternatively between the antenna of the TUT and the FA. This term is characterized by being the same for all positions of the moving objects. Therefore, we can remove it by the following procedure. We measure the transmitted or received complex amplitude (i.e. both amplitude and phase) for each position of the moving objects. We can easily do this by using a network analyser. The phases of the part of the received complex amplitudes samples, which are due to the modal distributions in the chamber, vary uniformly between zero and 360 degrees, whereas the phase of the erroneous direct coupling term is constant. Therefore, if we average all received complex amplitudes over the positions of the moving objects, the average amplitude will be an estimate of the amplitude of the error term, and the estimate is better the more amplitude samples we have. An improved power estimate is thereafter found by averaging (over the positions of the moving objects) the square of the difference between the complex amplitude sample and the error term estimate. If we also use a moving or rotating platform, we should preferably during the averaging use different estimates of the error term for each platform position. The described removing of the error due to direct coupling is most easy to do in a measurement set-up with a network analyser.

2) In a measurement set-up with a network analyser we have two ports; port 1 being the input of the FA, and port 2 being the port of the AUT. From the network analyser we get the so-called S-parameters of this two-port, which are 3 complex amplitudes, which hence contain both amplitude and phase information, and which vary with frequency. These S-parameters are named S11 (which is the reflection coefficient at port 1), S22 (which is the reflection coefficient at port 2), and S12 (which is the transmission from port 1 to port 2). The opposite S21 is equal to S12. The transmitted power referred to previously is equal to the square of the absolute value of S12. There are frequency variations of S12 that are due to the direct coupling mentioned in §1 above, but also due to variations in S11 and S22. The frequency variations due to S11 and S22 can be removed as follows. We first average all samples of S11 over the different positions of the moving objects, and call it S11av. Correspondingly for S22 to obtain S22av. S11av and S22av represent estimates of the reflection coefficients of the FA and the AUT when they are located in "free space". We calculate the corrected power samples by the following formula $P12c=|S12|^2/[(1-|S22av|^2)(1-|S11av|^2)]$ and average them over all positions of the movable and rotate-able objects. This averaged power sample $P12c$ will have much smaller frequency variation than $P12=|S12|^2$, and hence can be averaged in frequency with better accuracy. When we calculate the resulting radiation efficiency we should preferably remember to use the correction formula both for the reference antenna and the AUT, and to remember that the radiation efficiencies obtained are only those parts, which are caused by ohmic losses in the antenna and its near-in environment, as we already have removed the mismatch part from the power samples. We can include the latter again by multiplying the obtained radiation efficiency with $(1-|S22|^2)$. This described approach can also be used if we only correct for one of S11 and S22. It can also be used in a measurement set-up by which we measure communication power (CP), even if we then use a spectrum analyser or power meter. In that case, we need to know or measure S11 of the FA in a separate measurement set-up including a network analyser or similar, and correct the power samples with it before doing the frequency averaging.

3) In the previous method 2 we described how to correct the power samples by the following formula $P12c=|S12|^2/[(1-|S22av|^2)(1-|S11av|^2)]$ and average them over all positions of the movable and rotate-able objects. This was advantageous because $P12c$ has much smaller frequency variation than $P12=|S12|^2$. When the chamber is loaded with a lossy object, it is also known that $P12c$ varies with frequency f according to $1/f^2$. This known dependence can with advantage be used to perform a weighted averaging of $P12c$ to improve the accuracy further.

The Q-value of the chamber is essential. This is determined by the loads which the FA and the AUT or TUT represent, and in addition the load provided by the lossy material in the previously described "near-in environment" (e.g. a phantom head), which is placed into the chamber together with the AUT. When comparing different test cases, such as the reference antenna and the AUT, or the reference terminal and the TUT, it is very important that the Q-value of the chamber is exactly the same. This means that if we measure an AUT (or TUT) close to a given lossy environment, we should preferably measure the reference antenna (or reference terminal) with the same environment present in the chamber, but located so far away from the reference antenna that it's radiation efficiency (or radiated power) is not affected by it. This required minimum distance is normally around 0.5 wavelengths.

According to the above, it is evident that the measurement apparatus and method can be used to estimating the absorption of radiated electromagnetic radiation in human bodies or other lossy objects, being arranged in a nearby environment to the AUT or TUT. This can be done by locating the AUT or TUT beside e.g. a head phantom inside the chamber, and measuring the radiation efficiency or radiated power for this location. The difference between the result for this case and the result for the case when the AUT or TUT is located more than 0.5 wavelengths away from the phantom head, corresponds to power lost either in the head phantom or as reflections at the port of the AUT due to mismatch. The two losses can be separated by an additional conventional measurements of the reflection coefficient of the AUT by using a network analyser or similar, or by using the value of S22av described above as the "free space" reflection coefficient. Hereby, a fast and easy and surprisingly reliable estimation of the absorption in the head phantom is obtained. In this way we will also measure the effect of the head phantom on the communication power (CP) of the terminal.

Measurements in the described chamber can be disturbed by interference due to other users of the same frequency band. The chamber is metallic and therefore to some degree shielded against such interference. It is also possible to put special effort into such shielding. E.g., the door to the chamber can be made with a magnetic flange that can provide good conducting contact with a similar magnetic flange at the chamber opening. Also, other means of improving the shielding of the chamber can be implemented.

It must be emphasized that it is also possible to measure the radiation efficiency of the AUT by using the fixed antenna FA as a reference antenna. The square of the statistic part S11s of the measured S11 of the FA, which is S11 minus its deterministic "free space" reflection coefficient which we above have referred to as S11av, will be proportional to the radiation efficiency of the FA squared. Thus, the reference level for calculating the radiation efficiency from P12c above can also be found from an averaging of P11c=|S11s|²/[(1−|S11|²)²] over the positions of the moveable and rotate-able objects, provided the FA is lossless. The advantage of using the FA as a reference antenna is that we may avoid an extra measurement of the reference antenna, and, that we always will be sure that the reference antenna is measured under exactly the same conditions as the AUT. When using the FA as a reference antenna we will need to correct for a non-uniformity of the power density in the chamber near to the wall, and for the fact that the received level at an antenna when the antenna also is used to excite the chamber is higher than when the excitation and receiver antennas are different. However, these corrections can be sorted out in advance and will not change with the AUT.

It is also clear that we may reduce the whole measurement set-up for the radiation efficiency to only measuring the reflection coefficients, i.e., no measurements of transmission S12. Then, we need only to have one antenna in the chamber at the time. There is no need for the fixed antenna FA. We obtain the radiation efficiency by first measuring the reflection coefficient S22 of the reference antenna in the chamber, and thereafter we replace the reference antenna with the AUT and measure the reflection coefficient S22 of the AUT. Finally, the radiation efficiency squared is obtained by taking the relation between the two levels. Before doing this we should preferably in the same way as described for S11 in the previous paragraph remove the deterministic "free space" reflection coefficient from both and average the square of the remaining statistic parts over all positions of the moveable and rotate-able objects. In this way we get a simpler measurement set-up, and we avoid problems with direct coupling between the FA and AUT.

When measuring CP, we are not able to remove the error due to the direct coupling between the FA and the antenna of the TUT. However, it is a fact that this error is larger the more the chamber is loaded with lossy material. Therefore, we may improve the accuracy of a CP measurement by reducing the size of the head phantom, e.g. by cutting it in two halves and using one of them at the time.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE FIGURES

The invention will now be described in more detail with reference to preferred embodiments. However, it should be understood that different features in the specific embodiments are, unless otherwise stated, exchangeable between the embodiments. Further, the embodiments relate to measuring of the performance of an antenna, or of a mobile or wireless terminal.

Figure 1:
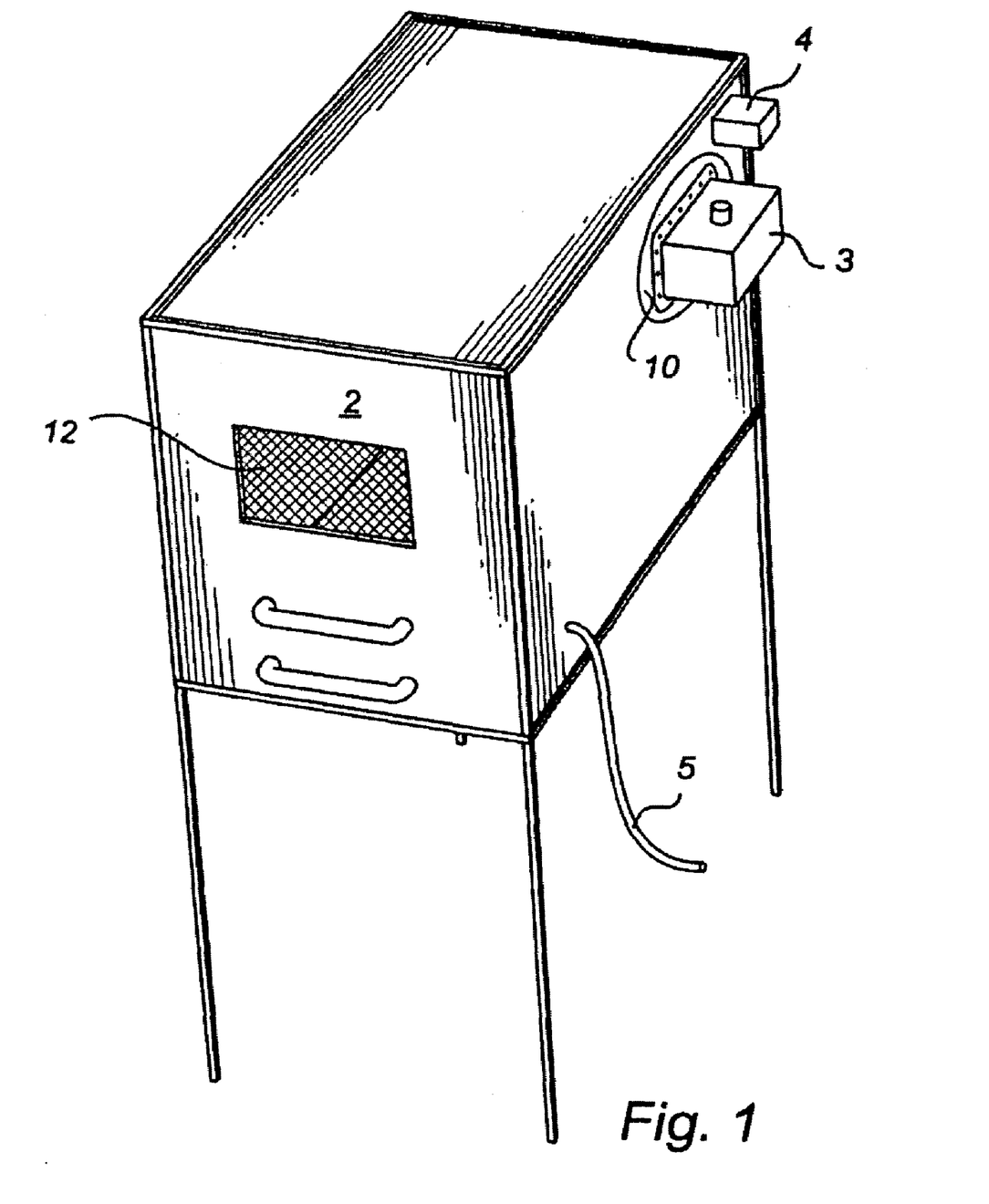
FIG. 1 shows a schematic illustration of the exterior of an apparatus according to an embodiment of the invention, illustrating the chamber with closed door.

FIG. 1 shows an apparatus for measuring the performance of antennas and mobile or wireless terminals, and specifically for antennas and terminals intended to be used in a multipath environment, according to a first embodiment of the invention. The apparatus comprises a rectangular chamber 1 with width W, length L and height H, with a door 2. The apparatus further comprises a fixed antenna (FA) 3 in the form of a coax-to-rectangular waveguide transition, and a step motor 4. The door has two handles so that it easily can be lifted up and removed. The FA is mounted on a circular metal plate 10, which is fixed to the chamber wall in such a way that it can be rotated around manually and fixed at different angular orientations. A cable 5 is connected to the antenna under test (AUT) 9 inside the chamber. The AUT and the FA are connected to analysing means, such as a commercially available measuring instrument, such as a network analyser or spectrum analyser or similar, for determining the transmitted power between the antennas. As mentioned before, the AUT could be used either for transmission or reception, and the FA similarly for reception or transmission, respectively.

Figure 2:
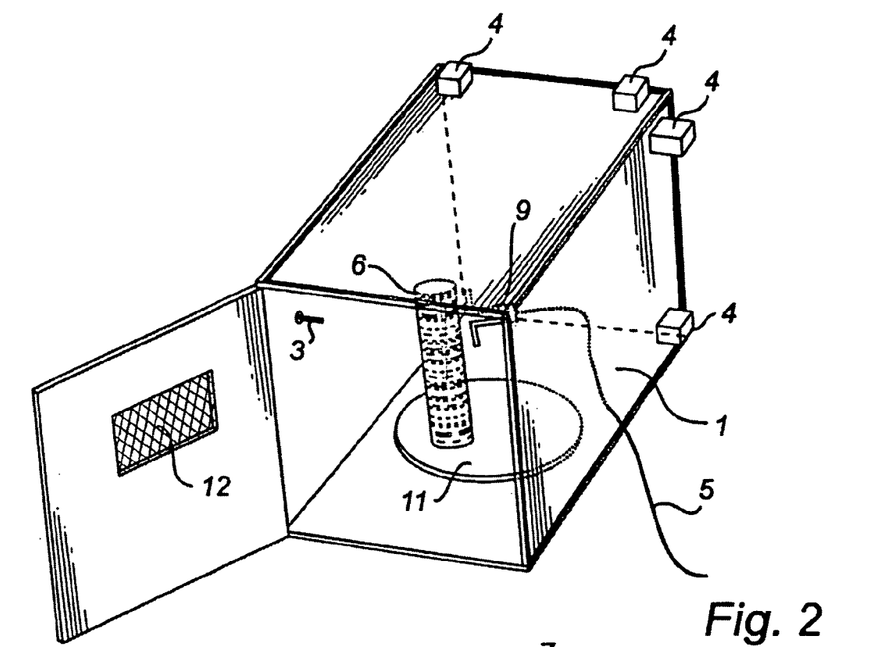
FIG. 2 shows a schematic illustration of an apparatus according to an embodiment of the invention, illustrating the chamber with open door.

FIG. 2 shows a rectangular chamber for measuring the performance of antennas and mobile or wireless terminals, according to an embodiment of the invention. The door is shown in its open position. We can see an AUT 9 located inside the chamber on a rotate-able platform 11, as well as its "near-in-environment" object 6. In this embodiment the near-in-environment object is a dielectric cylinder that is filled with lossy material with similar dielectric properties as human tissue. The fixed antenna (FA) 3 is a monopole located at the wall and attached to a coaxial connector on the outer wall. The monopole could also be a helical antenna or a microstrip match antenna or any other small antenna. The door has a window 12 that is made of conducting metal wires in order to provide reflection of the waves and shielding, but still allowing visual inspection through it. The room has 4 step motors 4.

Figure 3:
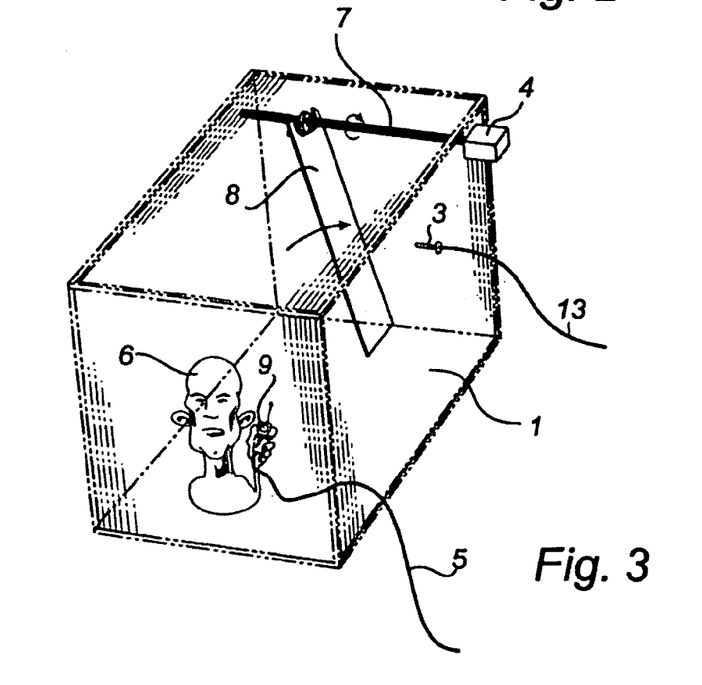
FIGS. 3 to 5 show schematic illustrations of different embodiments of the apparatus according to the invention, showing the interior of chambers, whereas the walls are illustrated as being invisible.

FIG. 3 shows the interior of a rectangular chamber according to another embodiment. In this case a near-in-structure 6 in the form of a head phantom is used, and an AUT 9 is mounted on a mobile phone. The elongate object 8 is turn-able around an axis of rotation, arranged at one end of the object in order to generate independent field distributions in the chamber, simulating a multipath environment. The other end is engaged by displacing means, such as the long screw 7 which is rotated around by a driving means, such as a servo motor or a step motor 4, and a nut on this screw to which the elongate narrow object 8 is fastened. It is however possible to use other means for displacing the elongate object. The long narrow object has the form of a metal sheet, but it can also have many other forms, e.g. it is advantageous to give it an irregular form. The long narrow object moves across the wall of the chamber when the step motor rotates the screw around. The movement of the elongate object could be made intermittently between measurements or during a measurement, or even be performed continuously during a measurement. There is a fixed antenna (FA) 3 in the form of a monopole antenna. This is connected via the wall to a coaxial connector on the outer side, and there is a cable 13 connected to this connector.

Figure 4:
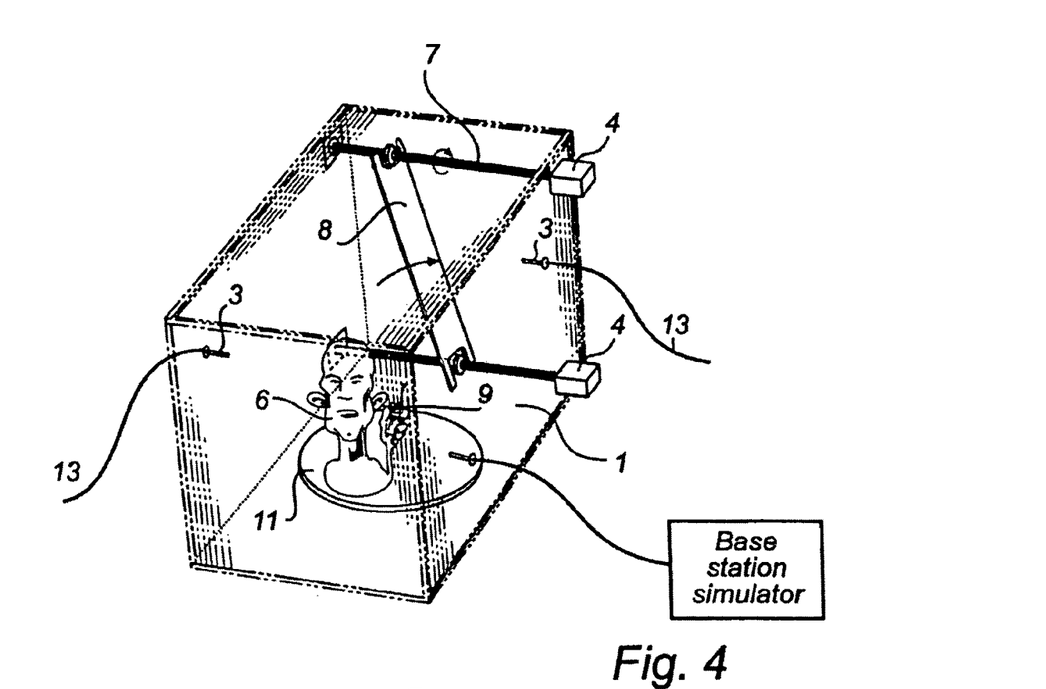

FIG. 4 shows the interior of a rectangular chamber according to another embodiment. In this case a near-in-structure 6 in the form of a head phantom is used, and an TUT 9 in the form of a mobile phone is mounted close to the head phantom. The elongate object 8 is the same as in FIG. 3, but 2 step motors 4 can move it. In addition, the head phantom and the phone are located on a rotate-able platform 11, which improves the measurement accuracy. The mobile phone can preferably be controlled to radiate its maximum output power by using a base station simulator. This can be connected to a second fixed antenna of the chamber, to enable communication with the mobile phone.

Figure 5:
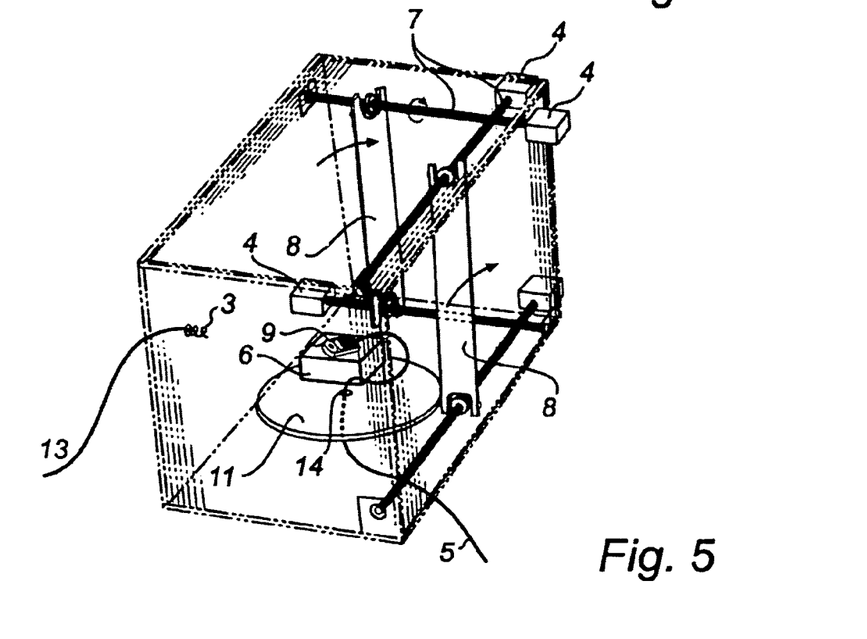

FIG. 5 shows the interior of a rectangular chamber according to another embodiment. This chamber has 4 driving motors 4 and two elongate narrow objects 8, whereby the elongate objects are movable in different, and preferably perpendicular directions. The AUT 9 is in this embodiment a terminal antenna on the chassis of a mobile phone. The near-in-environment 6 is a wooden box, (e.g. simulating a table surface) on which a phone with the AUT is placed. The table with the phone is located on a rotate-able platform 11 as in FIG. 2. The cable 5 is connected to a rotary joint 14 in the centre of the platform 11.

The elongate moveable object can be provided with an irregular cross sectional shape, and preferably a cross sectional shape that varies along its length. The fixed antenna (FA) could further preferably be an electric monopole 14 or helical antenna or similar, which is fastened to one of the chamber walls. Further, the FA is preferably connected to the centre conductor of a cable connector (for panel mounting) on the outer side of the walls.

Figure 6:
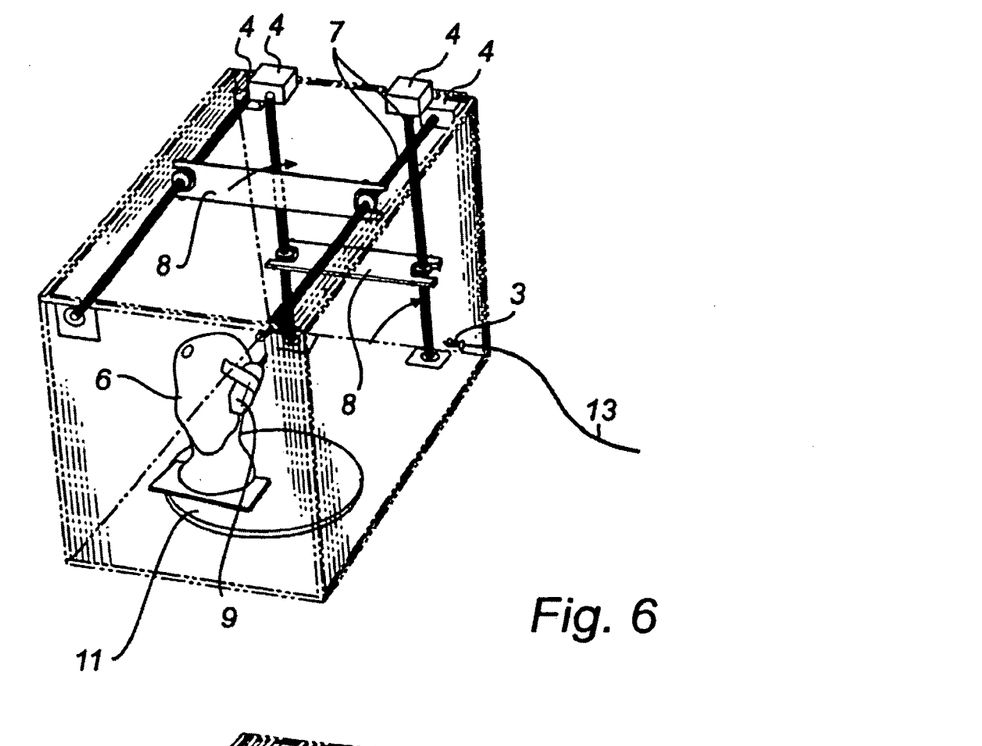
FIGS. 6 to 7 show schematic illustrations of further embodiments of the apparatus according to the invention, showing the interior of chambers, whereas the walls are illustrated as being invisible.

FIG. 6 shows the interior of a rectangular chamber according to another embodiment. This chamber has 4 driving motors 4 and two elongate narrow objects 8, whereby the elongate objects are movable in different, and preferably perpendicular directions. One of the elongate objects is located in the ceiling of the chamber to save place. The TUT 9 is in this embodiment a mobile phone. The near-in-environment 6 is a head phantom. The TUT and head phantom are located on a rotate-able platform 11.

Figure 7:
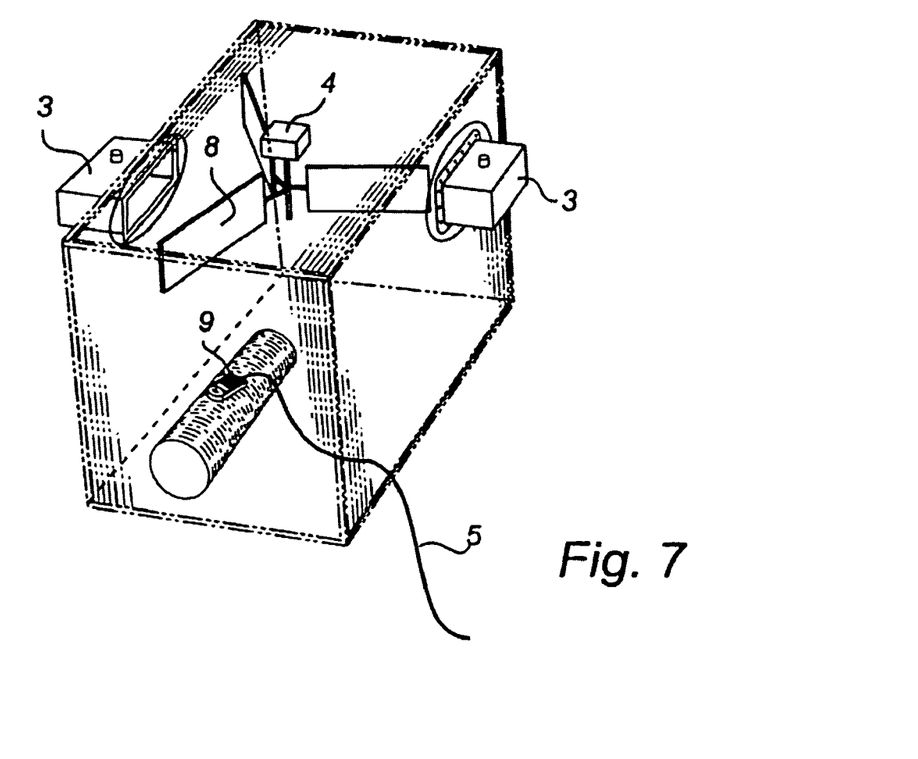

FIG. 7 shows the interior of a rectangular chamber according to still another embodiment, where the moving object 8 is instead fan-shaped, and the near-in environment 6 is a horizontal cylinder.

The driving means are preferably one or several driving motors, such as step-motors. However, other driving means, such as servomotors or the like are also feasible.

When using at least two moving objects 8, they could be moved simultaneously. However, it is in this case preferred to drive them sequentially. Most preferably, one of the moving objects are first moved to a first position, where after the second is moved through several, and preferably all, different positions. Thereafter, the first moving object is moved to a second position, and the procedure is repeated. A similar sequential procedure is also possible for three or more moving objects. With such a sequential procedure, the number of excited modes could be increased, resulting in an improved accuracy and precision of the measurement. Further, the number of different positions of the individual moving objects could be reduced without significant loss of precision.

When using other movable objects in the chamber, such as a movable platform for the antenna under test (AUT), such movable objects may be moved in a corresponding sequential fashion.

The moving objects 8 could be arranged in many different locations in the chamber. Specifically, it is preferred to arrange at least one of the moving objects near the ceiling of the chamber, where there is normally unused space. Hereby, the width and length of the chamber could be kept small.

Figure 8:
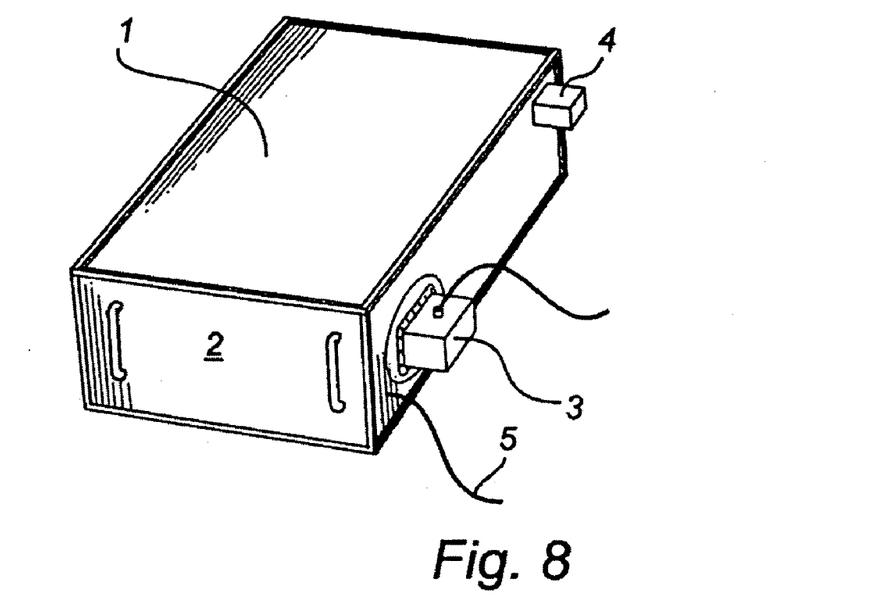
FIGS. 8 to 10 show schematic illustrations of three embodiments of the chamber according to the invention, the chambers being shown with closed doors.

FIG. 8 shows rectangular chamber according to an embodiment of the invention that has a height H, which is minor than, and e.g. about half, the width W and length L.

Figure 9:
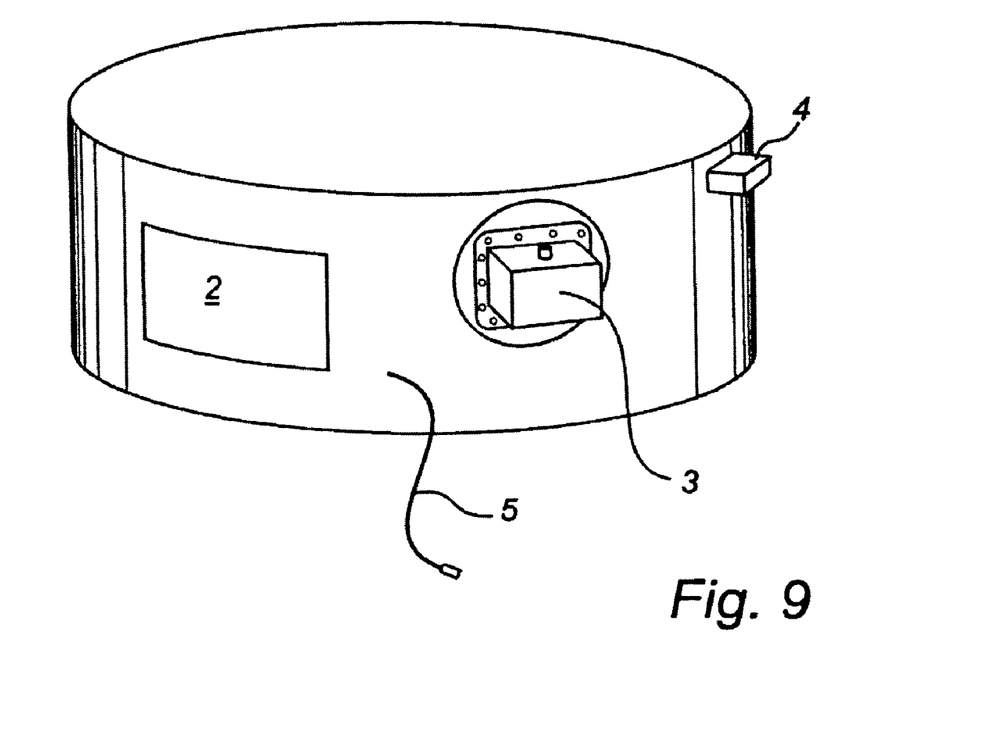
Figure 10:
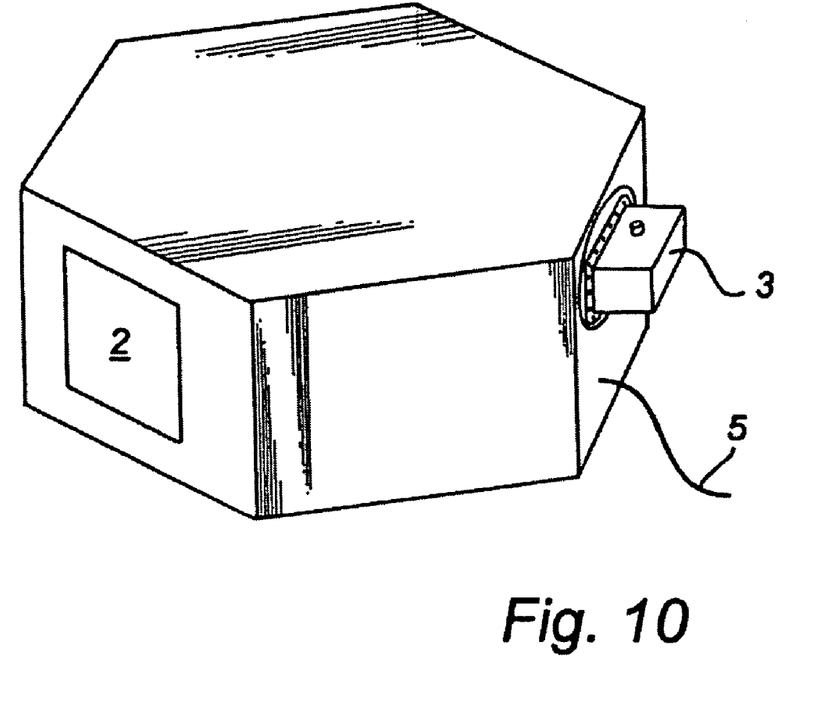

FIG. 9 shows an alternative chamber form with a circular horizontal cross section, and FIG. 10 an alternative chamber form with a cross section in the form of a polygon.

The chamber, according to any of the embodiments described above, is preferably made of metal plates which are connected together along at least some of the sides or corners by profiles comprising grooves for receiving the ends of at least two adjacent metal plates. The profiles are preferably made of metal as well, preferably such profiles are arranged between all the metal plates, and with special corner elements arranged in the corners, arranged with grooves for receiving three adjacent metal plates. Such profiles are previously known, and are commercially available. Hereby, the chamber becomes easy to produce and assemble, and it will also be possible to have the chamber unassembled during transports and the like, and to assemble it at where it is to be used.

Further, at least one of the walls of the chamber preferably comprises at least one window for visual inspection of the interior of the chamber during measurements. Hereby, a visual inspection of especially the mechanically movable parts of the apparatus could be made. The window should be made reflective for electromagnetic waves at the measurement frequencies. Preferably, the windows comprises a grid of conducting wires, where at least two sets of wires run in different directions, and preferably approximately orthogonal directions.

The measurement chamber has reflective walls and doors, so the chamber is to some degree shielded. However, the degree of shielding is not particularly high compared to what a normal so-called shielded room has. In such a known shielded room there should preferably be very good electrical contact at all joints between walls, between metal plates making up the walls, around the periphery of doors, and in corners. This is assured by welding the joints together or by screwing them together with closely spaced screws along the joints; and by using special means for maintaining good contact around the rim of a door even after opening and closing it thousands of times. It could also be done by other means, e.g. by using a metal wire mat between all joints, which assures good electric contact between the two parts. In the present invention such expensive welding, screwing and other means for assuring good electric contact is not needed. The only worry is to keep the leakage from the chamber so low that it does not affect the Q-value of the chamber significantly during operation. This Q-value is from before not extremely high, because the chamber is normally loaded with lossy material during operation.

The shielding efficiency of a shielded room with absorbing walls is normally characterized in terms of a shield attenuation, which is the negative level in dB received between two antennas located 30 cm from the wall on either side of it, plus the level in dB when the antennas are located in free space at a distance from each other of 60 cm plus the wall thickness. The shield attenuation of the invention can be measured if absorbers inside it (e.g. on the floor and along the opposite wall) are located in order to kill the multiple reflections, and then measure the shield effectiveness of each wall at the time. A high performance shielded room with absorbing walls has shield attenuation in the 100 MHz to 10 GHz range of 50-100 dB. The walls of the inventive chamber can have between 20 and 40 dB shield attenuation, but it may also be a high performance shielded room in order to avoid possible interference from other microwave sources outside the chamber, such as mobile phones and base station antennas.

Still further, the chamber could comprise at least one semitransparent grid of parallel wires or grid of periodic elements. Such a grid could be used for controlling the polarization and elevation distribution of the incoming waves. Further, the cable from the AUT preferably extends through one of the walls of the chamber as well, and preferably via a special connector for wall mounting.

Figure 11:
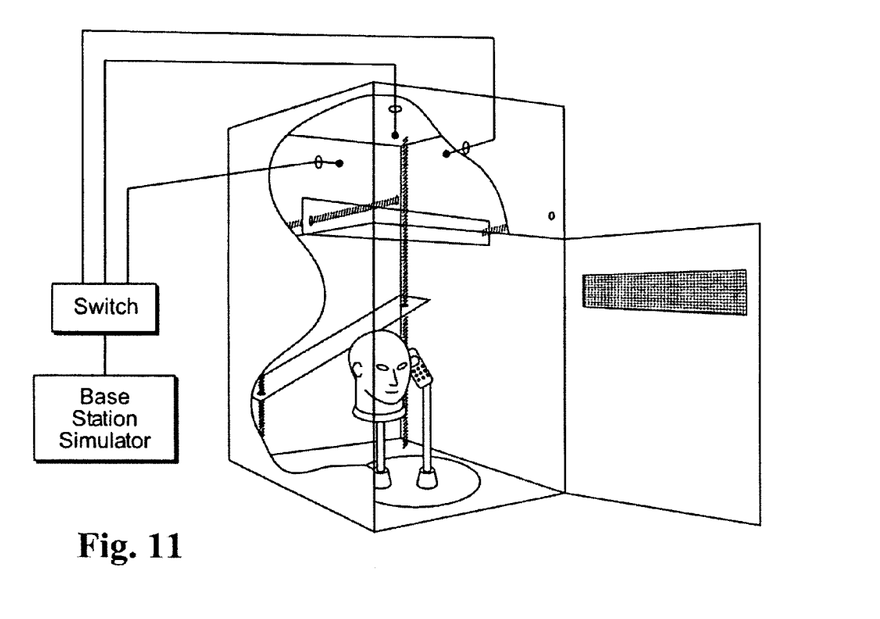
FIG. 11 shows a schematic illustration of a reverberation chamber setup for measurement of both Total Isotropic Sensivity and average BER or FER of a mobile or wireless terminal, such as a cellular phone.

Further, with the chamber according to the invention, the antenna under test (AUT) could be an adaptive antenna 9', as is illustrated in FIG. 11. By adaptive antenna is here meant an antenna comprising two preferably uncoupled antenna elements (for polarization, spatial or angular diversity), designed to work together in such a way that the antenna system, in which the adaptive antenna is to be used, chooses the signal from that element which transmits the strongest signal to or receives the strongest signal from the antenna at the desired opposite end of the communication link, or in other ways combines the signal from the two antennas in an optimum way. When measuring adaptive antennas the ports of the two elements of the adaptive antenna are preferably connected to separate cables that are passing through the walls of the chamber, preferably by means of wall mounted cable connectors, or via a dual-port rotary joint in the centre of the rotate-able platform stirrer. Further, the two elements of the adaptive antenna could be connected to an adaptive antenna receiver that chooses the strongest signal of the two ports. Each of the two elements of the adaptive antenna could also be connected to power detectors 11, which output power levels are added in a power combiner 12 and measured, so as to measure the diversity gain directly in the measuring unit 13.

For different reference measurements a reference antenna (or a reference terminal) with known properties and performance is preferably used. For the reference measurement it is possible to replace the AUT (or the TUT) with the reference antenna (or terminal). However, it is also possible to arrange the reference antenna (or terminal) together with the AUT (or TUT) in the chamber. In this case, the same settings and the same environmental conditions are obtained for the measurement, regardless whether the reference antenna or the AUT is used for the measurement. Consequently the reliability and precision of the measurements improve.

Measurement of Receiver Sensitivity

The above discussed measurement method and measurement apparatus is also usable for determining receiver sensitivity.

FIG. 11 shows the setup in reverberation chamber for measurement of both Total Isotropic Sensitivity and average BER or FER of a mobile or wireless terminal such as a cellular phone. A standard reference case with a dipole is used to calibrate the average transmission loss in the chamber. During the measurements, the phone is placed in the chamber according to the chosen talk position. For free space measurements, the head phantom is located in the chamber in order to keep the same average transmission level, but the phone is preferably placed at a distance of 0.7 wavelengths, or more, away from the head phantom. The base station simulator is connected via a switch to the three fixed antennas mounted on the walls of the chamber. A communication link between the phone and the base station is set up by initiating a call from the instrument.

Even though the embodiment illustrated in FIG. 11 is specifically dedicated for the use of estimating receiver sensitivity, it is to be appreciated by the skilled addressee that all the above-discussed chamber and set-up embodiments are also applicable for this use. Thus, the measurements chamber and set-up according to FIG. 11 could be modified in accordance with essentially all of the above-discussed embodiments discussed with reference to FIG. 1-10.

Total Isotropic Sensitivity (TIS) is a standard way of describing the radiated properties of a mobile phone in the downlink band. It is equal to the conducted receiver sensitivity of the phone, measured directly at the receiver port, when this is degraded by the radiation efficiency of the phone antenna as well as any other disturbances that can be guided through the antenna. The TIS parameter is based on measurements of Bit-Error-Rate (BER) or Frame-Error-Rate (FER) for the tested phones. For the CDMA system FER is the applicable quantity. The formula for TIS when measured in the reverberation chamber can be derived in the same way as for an anechoic chamber. This results in:

$$TIS = C_c \left( \frac{1}{N} \sum_{n=1}^{N} \frac{1}{P_{BSS}(n)} \right)^{-1}$$

where Cc is a correction factor including the average transmission in the chamber, mismatch of fixed antennas and cable losses (between the base station simulator and the fixed antennas in the chamber), and PBSS(n) is the output power from the base station simulator when this is adjusted to give the specified FER in the phone for position n of the mode-stirrers. The actual procedure in the reverberation chamber comprises moving the mode-stirrers to a certain number of positions N. In each of these postions, the output power is adjusted from the base station simulator so that the chosen FER limit is reached. The powers are collected and inserted in the above equation to calculate the TIS.

Since the reverberation chamber as discussed above supports a Rayleigh distribution of received amplitudes, we can, e.g. by continuously moving the stirrers or the like in the chamber, simulate a real-time fading environment. By making use of this real-time fading, we can directly measure the average FER for a phone in the environment. This is e.g. done by continuously sampling the FER during a complete sequence of the mode-stirrers. The base station simulator is preferably set to transmit at a fixed power level during the full sequence. By repeating this for a few power levels we can determine the average fading sensitivity when the average FER is 0.5%. The average fading sensitivity will have a numerical value that is different from TIS. However, when the fading is slow, there will be a constant difference between the two for environments with Rayleigh distributed signal amplitudes.

Experimental Results

In a measurement performed in the above-discussed set-up according to FIG. 11, the phone was placed in the chamber according to a chosen talk position. For free space measurements, the head phantom was located in the chamber in order to keep the same average transmission level, but the phone was placed at a distance of 0.7 wavelengths, or more, away from the head phantom. The base station simulator was connected via a switch to a three fixed antennas mounted on the walls of the chamber. A communication link between the phone and the base station was set up by initiating a call from the instrument. Measurements were in this way performed on a set of three CDMA2000 phones, named A, B, and C, respectively. All three phones were dual-band for band 0 (Cell) and band 1 (PCS), corresponding to 800 MHz and 1900 MHz bands, respectively. Phones A and B were of the same model, which means that they should be very close in performance. Of convenience, one of the connection channels for each phone was chosen for the initial tests. For phones A and B channel 283 channels was measured, and for phone C channel 356.

For the initial TIS-tests carried out at Cell-band, a total of 60 samples were used. The time needed for the measurements was about 60 minutes per channel and talk position. The measurements of average fading sensitivity were performed by setting the base station simulator to a fixed output power and measuring FER on-the-run for a complete sequence of the mode-stirrers. This was done for several output powers so that the relation between average received power and FER could be investigated, i.e. each of the measured sequences correspond to one point in FIG. 12 where FER is plotted versus the average power at the antenna of the mobile. Also, the TIS values are plotted in the FIG. 12. For the average-FER measurements an 80 second long sequence was used, which made it possible to get 4000 frame samples for calculation of the FER.

Figure 12:
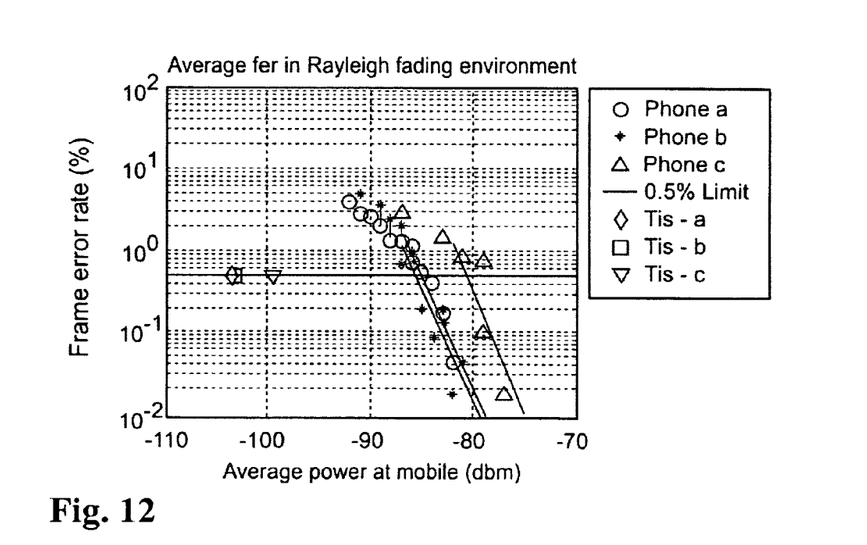
FIG. 12 shows average FER measured in the Rayleigh fading environment of a reverberation chamber for three phones in free space position measured at the Cell band. The TIS values in free space are also shown

The results from the TIS and average fading sensitivity measurements are shown in table 1 below, and in FIG. 12. The average fading sensitivity values in the table are obtained by fitting a linear function to the part of the samples that correspond to FER <2%. These should ideally have an asymptotic behavior that resembles a line. In FIG. 12 we see that the average FER could be used as a faster way of evaluating the receiver properties of the mobile phone. The TIS as well as the average FER of the two phones A and B (same model) are very similar as they should be, whereas the third phone C shows a degraded performance of both TIS and FER relative to phones A and B (points are placed more to the right in the plot). This is also more clearly seen from the values in table 1. We see that the degradation of phone C is 3.75 dB in the case of TIS and 4.7 dB in the case of average fading sensitivity. These values are quite close. It is expected that there theoretically is a constant factor between TIS and average fading sensitivity. It should also be noted that the present measurements were done in Cell-band (800 MHz band) without frequency stirring, so the accuracy of the chamber is not very good. Therefore, the discrepancy between the two 3.75 dB and 4.7 dB degradations most probably is due to the measurement accuracy.

The advantage of using the average fading sensitivity method instead of TIS is partly the shorter measurement time; a measurement could be completed in less than 10 minutes. Another advantage is that the mobile actually experience a real-time fading, which might be a more proper test for the unit, especially in the case of a diversity system.

TABLE 1

TIS and average fading sensitivity (AFS) measured in free space position inside the reverberation chamber. Phones A and B are the same model and measured at channel 283 (Cell band). Phone C is a different model and measured at channel 356 (Cell band):

|  | TIS (dBm) | AFS (dBm) | Levels compared to average of phones A and B | |
|---|---|---|---|---|
|  |  |  | TIS (dB) | AFS (dB) |
| Phone A | −103.5 | −84.8 | −0.15 | +0.3 |
| Phone B | −103.2 | −85.4 | +0.15 | −0.3 |
| Phone C | −99.6 | −80.4 | +3.75 | +4.7 |

Based on measured results, we conclude that the average fading sensitivity is a promising alternative to TIS measurements for characterizing receive performance of mobile terminals. The reverberation chamber is well suited for both these measurements. Average fading sensitivity measurements can be done faster than TIS and give similar relative results. I.e., the average fading sensitivity shows similar difference between the different phones as the TIS results, when we for both cases read the sensitivity levels at 0.5% error level.

The invention is not limited to the realizations described above, but any combinations of the embodiments are possible. Further, the near-in objects may be of any form and material. Further, the chamber may take any form or dimension, and may be produced of any reflective material. In particular, the chamber may be made so small that it can be carried through a normal office door of about 80 cm width, without being taken apart. The number of FA: s to be used may also be more than one, such as two or even more.

The invention claimed is:

1. An apparatus for measuring the performance of mobile or wireless terminals, the terminals including at least both a receiver and an antenna, comprising:
   a chamber to enclose the terminal to be tested (TUT), the chamber having walls of an inwardly reflective material, rendering the walls reflective to electromagnetic waves;
   at least one movable object within the chamber; and
   an instrument to measure bit error rate (BER) or frame error rate (FER) connected to an antenna inside the chamber and set up to communicate with the TUT;
   wherein a signal received on the TUT shows fading obtained by moving the movable objects within the chamber.

2. The apparatus according to claim 1, wherein the terminal has more than one receive antenna and wherein said instrument measures the BER or FER of the signal received on said instrument.

3. The apparatus according to claim 1, wherein the TUT has more than one transmit antenna and wherein said instrument measures the BER or FER of the signal received on said instrument.

4. The apparatus according to claim 1, further comprising a transmitter with calibrated output power connected to a transmit antenna inside the chamber and a receive antenna, used in determining the average power transmission level of the chamber, where said averaging is done over at least different positions of said at least one moving object in the chamber.

5. The apparatus according to claim 4, wherein the transmitting and receiving antennas have known calibrated total radiation efficiency, where the total radiation efficiency includes both losses due to impedance mismatch and ohmic losses.

6. The apparatus according to claim 1, wherein one or more antennas with known calibrated total radiation efficiency are used for determination of the average power transmission level of the chamber, where said averaging is done over at least different positions of said at least one moving object in the chamber.

7. The apparatus according to claim 1, wherein the at least one moving object within the chamber is arranged to move continuously during a measurement operation, in order to provide a continuous fading.

8. The apparatus according to claim 1, wherein the chamber further comprises at least one door, which is closed during measurements, said door comprising an inwardly reflective material.

9. The apparatus according to claim 8, wherein the door is manually openable, and provides electrical contact with the chamber wall around the periphery of the door in closed condition.

10. The apparatus according to claim 1, wherein the TUT is mounted to be rotateable within the chamber.

11. The apparatus according to claim 1, wherein at least two movable objects are arranged in the chamber, said objects being sequentially movable during the measuring.

12. The apparatus according to claim 1, wherein the at least one movable object is elongate, said object being fixed relative to the chamber at an axis of rotation.

13. The apparatus according to claim 12, wherein the axis of rotation is arranged on one end of the elongate movable object, whereas the opposite end of the object is fastened to at least one displacing device.

14. The apparatus according to claim 1, wherein the at least one movable object is a rotateable, fan shaped object located close to one of the walls in the chamber.

15. The apparatus according to claim 1, wherein the chamber further comprises at least one object for simulating a typical near-in environment for the TUT.

16. The apparatus according to claim 15, wherein the at least one object for simulating a typical near-in environment comprises a lossy material with approximately the same dielectric characteristics and losses at the measurement frequency as human tissue or brain cells.

17. The apparatus according to claim 16, wherein the at least one object for simulating a typical near-in environment is a head phantom filled with a material with approximately the same dielectric characteristics and losses at the measurement frequency as the human brain.

18. The apparatus according to claim 1, wherein the chamber is large enough to provide at least thirty resonant cavity modes inside it within the frequency band of interest.

19. The apparatus according to claim 1, wherein the chamber is small enough to pass through a normal door of 80 cm width.

20. The apparatus according to claim 1, wherein the TUT is a mobile phone, which is intended to be used in a multipath environment.

21. The apparatus according to claim 1, wherein the movable object is elongate with both ends fastened to at least one movable displacing device.

22. The apparatus according to claim 1, wherein the moveable object is elongate with an irregular cross sectional shape that varies along its length.

23. The apparatus according to claim 1, wherein the chamber comprises a rotateable or displaceable device to carry the TUT during measurements, so as to move it relative to the chamber during measurement.

24. The apparatus according to claim 1, wherein at least two movable objects arranged in the chamber.

25. The apparatus according to claim 1, wherein the chamber is large enough to provide at least a hundred resonant cavity modes inside it within the frequency band of interest.

26. The apparatus according to claim 1, wherein the moveable object is elongate with an irregular cross sectional shape that varies along its length.

* * * * *